(12) United States Patent
Chen et al.

(10) Patent No.: US 6,706,637 B2
(45) Date of Patent: Mar. 16, 2004

(54) DUAL DAMASCENE APERTURE FORMATION METHOD ABSENT INTERMEDIATE ETCH STOP LAYER

(75) Inventors: Yu-Huei Chen, Hsin-Chu (TW); Yao-Yi Cheng, Hsin Chu (TW); Sung-Ming Jang, Hsin-Chu (TW); Chen-Hua Yu, Hsin-Chu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 10/143,700

(22) Filed: May 9, 2002

(65) Prior Publication Data

US 2003/0211746 A1 Nov. 13, 2003

(51) Int. Cl.$^7$ .............................................. H01L 21/311
(52) U.S. Cl. ........................ 438/700; 438/737; 438/751; 438/703
(58) Field of Search ................................. 438/700, 702, 438/703, 701, 705, 751, 737

(56) References Cited

U.S. PATENT DOCUMENTS

| 6,165,898 | A | 12/2000 | Jang et al. |
| 6,204,168 | B1 | 3/2001 | Naik et al. |
| 6,211,092 | B1 | 4/2001 | Tang et al. |
| 6,284,657 | B1 * | 9/2001 | Chooi et al. ................. 438/687 |
| 6,291,334 | B1 * | 9/2001 | Somekh ....................... 438/620 |

* cited by examiner

Primary Examiner—Caridad Everhart
(74) Attorney, Agent, or Firm—Tung & Associates

(57) ABSTRACT

Within a method for forming a dual damascene aperture there is surface treated a first dielectric layer to form a surface treated first dielectric layer having a first surface composition different than a first bulk composition. There is then formed upon the surface treated first dielectric layer a second dielectric layer having a second bulk composition. Finally, there is then formed through the second dielectric layer a trench contiguous with and overlapping a via formed through the surface treated first dielectric layer. Within the present invention, when forming the trench through the second dielectric layer an endpoint is determined by detecting a difference between the second bulk composition and the first surface composition.

16 Claims, 2 Drawing Sheets

DUAL DAMASCENE APERTURE FORMATION METHOD ABSENT INTERMEDIATE ETCH STOP LAYER

BACKGROUND OF THE INVENTION

1. Field of the Invention

The present invention relates generally to methods for forming dual damascene structures within microelectronic fabrications. More particularly, the present invention relates to methods for efficiently forming dual damascene structures within microelectronic fabrications.

2. Description of the Related Art

Microelectronic fabrications are formed from microelectronic substrates over which are formed patterned microelectronic conductor layers which are separated by microelectronic dielectric layers.

As microelectronic fabrication integration levels have increased and microelectronic device and patterned microelectronic conductor layer dimensions have decreased, it has become increasingly common in the art of microelectronic fabrication to employ interposed between the patterns of patterned microelectronic conductor layers when fabricating microelectronic fabrications microelectronic dielectric layers formed of comparatively low dielectric constant dielectric materials. Such comparatively low dielectric constant dielectric materials generally have dielectric constants in a range of from about 1.0 to less than about 3.6. For comparison purposes, microelectronic dielectric layers formed within microelectronic fabrications from conventional silicon oxide dielectric materials, silicon nitride dielectric materials and silicon oxynitride dielectric materials typically have comparatively high dielectric constants in a range of from greater than about 4.0 to about 8.0. Similarly, such patterned microelectronic conductor layers having formed interposed between their patterns microelectronic dielectric layers formed of comparatively low dielectric constant dielectric materials are typically formed within microelectronic fabrications while employing damascene methods, including in particular dual damascene methods.

Microelectronic dielectric layers formed of comparatively low dielectric constant dielectric materials are desirable in the art of microelectronic fabrication formed interposed between the patterns of patterned microelectronic conductor layers within microelectronic fabrications insofar as such microelectronic dielectric layers provide microelectronic fabrications which may theoretically operate at higher microelectronic fabrication speeds, with attenuated patterned microelectronic conductor layer parasitic capacitance and attenuated patterned microelectronic conductor layer cross-talk.

Similarly, damascene methods are desirable in the art of microelectronic fabrication for forming patterned microelectronic conductor layers having formed interposed between their patterns microelectronic dielectric layers formed of comparatively low dielectric constant dielectric materials insofar as damascene methods are comparatively simple fabrication methods which may often be employed to fabricate microelectronic structures which are not otherwise practicably accessible in the art of microelectronic fabrication.

While damascene methods are thus desirable in the art of microelectronic fabrication for forming patterned microelectronic conductor layers having formed interposed between their patterns microelectronic dielectric layers formed of comparatively low dielectric constant dielectric materials, damascene methods are nonetheless not entirely without problems in the art of microelectronic fabrication for forming patterned microelectronic conductor layers having formed interposed between their patterns microelectronic dielectric layers formed of comparatively low dielectric constant dielectric materials. In that regard, while damascene methods are generally successful for forming patterned microelectronic conductor layers having formed interposed between their patterns microelectronic dielectric layers formed of comparatively low dielectric constant dielectric materials, damascene methods do not always provide optimally low dielectric constant dielectric material layer constructions surrounding patterned conductor layers.

It is thus desirable in the art of microelectronic fabrication to provide damascene methods which may be employed in the art of microelectronic fabrication for providing patterned microelectronic conductor layers having formed interposed between their patterns microelectronic dielectric layers formed of comparatively and optimally low dielectric constant dielectric material layer constructions.

It is towards the foregoing object that the present invention is directed.

Various damascene methods have been disclosed in the art of microelectronic fabrication for forming within microelectronic fabrications damascene structures with desirable properties.

Included among the damascene methods, but not limited among the damascene methods, are damascene methods disclosed within: (1) Jang et al., in U.S. Pat. No. 6,165,898 (a dual damascene method for forming a contiguous patterned conductor interconnect and patterned conductor stud layer within a corresponding trench contiguous with a corresponding via formed through a dielectric layer within a microelectronic fabrication absent use of an extrinsic etch stop layer when forming the corresponding trench contiguous with the corresponding via, by employing when forming the dielectric layer a bilayer dielectric layer comprising: (a) a first dielectric material layer which is not susceptible to etching within an oxygen containing plasma, having formed thereupon; (b) a second dielectric material layer which is susceptible to etching within the oxygen containing plasma); (2) Naik et al., in U.S. Pat. No. 6,204,168 (a method for forming within a microelectronic fabrication a damascene structure with enhanced manufacturing efficiency by employing when forming the damascene structure a silicon based photosensitive material layer, such as a plasma polymerized methyl silane (PPMS) material layer, as both a hard mask layer and an etch stop layer); and (3) Tang et al., in U.S. Pat. No. 6,211,092 (a counterbore (i.e., via first) etch method for forming, with enhanced dimensional integrity, a dual damascene aperture within a microelectronic fabrication by employing within the counterbore etch method a plurality of etch steps for forming a via which in part comprises the dual damascene aperture).

Desirable in the art of microelectronic fabrication are additional damascene methods which may be employed in the art of microelectronic fabrication for providing patterned microelectronic conductor layers having formed interposed between their patterns microelectronic dielectric layers formed of comparatively and optimally low dielectric constant dielectric material layer constructions.

It is towards the foregoing object that the present invention is directed.

SUMMARY OF THE INVENTION

A first object of the present invention is to provide a damascene method for forming within a microelectronic fabrication a patterned microelectronic conductor layer having formed interposed between its patterns a microelectronic dielectric layer formed of a comparatively and optimally low dielectric constant dielectric material construction.

A second object of the present invention is to provide a damascene method in accord with the first object of the present invention, wherein the damascene method is readily commercially implemented.

In accord with the objects of the present invention, there is provided by the present invention a method for forming a dual damascene aperture within a dielectric layer. To practice the method of the present invention, there is first provided a substrate. There is then formed over the substrate a first dielectric layer. There is then surface treated the first dielectric layer to form a surface treated first dielectric layer having a first surface composition different than a first bulk composition. There is then formed upon the surface treated first dielectric layer a second dielectric layer having a second bulk composition. Finally, there is then formed through second dielectric layer a trench contiguous with and overlapping a via formed through the surface treated first dielectric layer. Within the present invention, when forming the trench through the second dielectric layer an endpoint is determined by detecting a difference between the second bulk composition and the first surface composition.

Further within the context of the present invention, a contiguous patterned conductor interconnect and patterned conductor stud layer may be formed into the dual damascene aperture, which comprises the trench contiguous with the via which in turn generally reaches a contact region within the substrate, while employing a blanket conductor layer deposition and planarizing method, preferably a blanket conductor layer deposition and chemical mechanical polish (CMP) planarizing method.

The present invention provides a damascene method for forming within a microelectronic fabrication a patterned microelectronic conductor layer having formed interposed between its patterns a microelectronic dielectric layer formed of a comparatively and optimally low dielectric constant dielectric material construction.

The present invention realizes the foregoing object when forming a dual damascene aperture by surface treating a first dielectric layer to form a surface treated first dielectric layer having a first surface composition different than a first bulk composition, prior to forming thereupon a second dielectric layer having a second bulk composition. Thus, within the present invention when forming through the second dielectric layer and the surface treated first dielectric layer the dual damascene aperture comprising a trench formed through the second dielectric layer contiguous with and overlapping a via formed through the surface treated first dielectric layer, an endpoint when forming the trench through the second dielectric layer is determined by detecting a difference between the second bulk composition and the first surface composition.

The damascene method in accord with the present invention is readily commercially implemented.

As will be illustrated in greater detail within the context of the Description of the Preferred Embodiment, as set forth below, the damascene method of the present invention employs methods and materials as are otherwise generally known in the art of microelectronic fabrication, but employed within the context of specific process limitations and specific materials limitations to provide the damascene method of the present invention. Since it is thus at least in part a series of specific process limitations and specific materials limitations which provides at least in part the present invention, rather than the existence of methods and materials which provides the present invention, the damascene method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a damascene method for forming within a microelectronic fabrication a patterned microelectronic conductor layer having formed interposed between its patterns a microelectronic dielectric layer formed of a comparatively and optimally low dielectric constant dielectric material construction.

The present invention realizes the foregoing object when forming a dual damascene aperture by surface treating a first dielectric layer to form a surface treated first dielectric layer having a first surface composition different than a first bulk composition, prior to forming thereupon a second dielectric layer having a second bulk composition. Thus, within the present invention when forming through the second dielectric layer and the surface treated first dielectric layer the dual damascene aperture comprising a trench formed through the second dielectric layer contiguous with and overlapping a via formed through the surface treated first dielectric layer, an endpoint when forming the trench through the second dielectric layer is determined by detecting a difference between the second bulk composition and the first surface composition.

As is understood by a person skilled in the art, the preferred embodiment of the present invention provides value within the context of forming, while employing a dual damascene method, and within a semiconductor integrated circuit microelectronic fabrication, a patterned microelectronic conductor layer having formed interposed between its patterns a microelectronic dielectric layer formed of a comparatively and optimally low dielectric constant dielectric material layer construction. However, the present invention may nonetheless be employed for forming analogous patterned conductor layers within microelectronic fabrications selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Referring now to FIG. 1 to FIG. 6, there is shown a series of schematic cross-sectional diagrams illustrating the results of progressive stages of forming, in accord with a preferred embodiment of the present invention, a contiguous patterned conductor interconnect and patterned conductor stud layer within a dual damascene aperture within a microelectronic fabrication.

Figure 1:
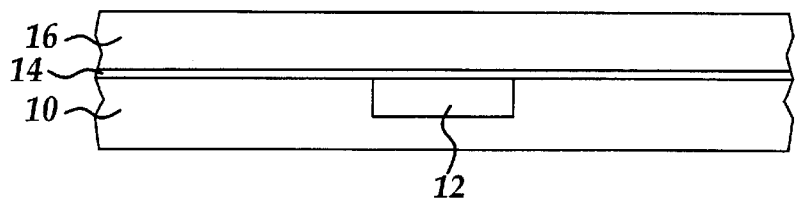
FIG. 1, FIG. 2, FIG. 3, FIG. 4, FIG. 5 and FIG. 6 show a series of schematic cross-sectional diagrams illustrating the results of progressive stages of forming, in accord with a preferred embodiment of the present invention, a contiguous patterned conductor interconnect and patterned conductor stud layer within a dual damascene aperture within a microelectronic fabrication.

Shown in FIG. 1 is a schematic cross-sectional diagram of the microelectronic fabrication at an early stage in its fabrication in accord with the preferred embodiment of the present invention.

Shown in FIG. 1, in a first instance, is a substrate 10 having formed therein a contact region 12.

Within the preferred embodiment of the present invention with respect to the substrate 10, the substrate 10 may be a substrate employed within a microelectronic fabrication selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Although not specifically illustrated within the schematic cross-sectional diagram of FIG. 1, the substrate 10 may consist of a substrate alone as employed within the microelectronic fabrication, or in an alternative, the substrate 10 may comprise a substrate as employed within the microelectronic fabrication, wherein the substrate has formed thereupon and/or thereover any of several additional microelectronic layers as are conventionally employed within the microelectronic fabrication within which is employed the substrate. Similarly with the substrate alone as employed within the microelectronic fabrication, such additional microelectronic layers may be formed from microelectronic materials selected from the group including but not limited to microelectronic conductor materials, microelectronic semiconductor materials and microelectronic dielectric materials.

In addition, and although also not specifically illustrated within the schematic cross-sectional diagram of FIG. 1, the substrate 10, typically and preferably, but not exclusively, when the substrate 10 consists of or comprises a semiconductor substrate as employed within a semiconductor integrated circuit microelectronic fabrication, has formed therein and/or thereupon microelectronic devices as are similarly also conventional within the microelectronic fabrication within which is employed the substrate 10. Such microelectronic devices may be selected from the group including but not limited to resistors, transistors, diodes and capacitors.

Within the preferred embodiment of the present invention with respect to the contact region 12, the contact region 12 is typically and preferably either: (1) a semiconductor contact region, particularly under circumstances where the substrate 10 consists of or comprises a semiconductor substrate as employed within a semiconductor integrated circuit microelectronic fabrication; or (2) a conductor contact region, under circumstances where the substrate 10 is employed within any of the several foregoing microelectronic fabrications.

Shown also within the schematic cross-sectional diagram of FIG. 1, and formed upon the substrate 10 having formed therein the contact region 12, is a pair of layers comprising: (1) an optional blanket first etch stop/liner layer 14 formed upon the substrate 10 having formed therein the contact region 12; and (2) 10. a blanket first dielectric layer 16 formed upon the optional blanket first etch stop/liner layer 14.

Within the preferred embodiment of the present invention with respect to the optional blanket first etch stop/liner layer 14, the optional blanket first etch stop/liner layer 14 may be formed employing methods and materials as are conventional in the art of microelectronic fabrication. Such materials may include, but are not limited to, dielectric etch stop materials selected from the group consisting of silicon oxide etch stop materials, silicon nitride etch stop materials, silicon oxynitride etch stop materials and silicon carbide etch stop materials deposited employing methods including but not limited to chemical vapor deposition (CVD) methods, plasma enhanced chemical vapor deposition (PECVD) methods and physical vapor deposition (PVD) sputtering methods. From a practical perspective, and under circumstances where the contact region 12 is formed of a copper containing conductor material, a preferred etch stop material for forming the optional blanket first etch stop/liner layer 14 is either a silicon nitride etch stop material or (more preferably due to dielectric constant considerations) a silicon carbide etch stop material, insofar as copper containing conductor materials are understood in the art to be susceptible to interdiffusion with silicon oxide etch stop materials. Typically and preferably, the optional blanket first etch stop/liner layer 14 is formed to a thickness of from about 300 to about 500 angstroms.

Within the preferred embodiment of the present invention with respect to the blanket first dielectric layer 16, the blanket first dielectric layer 16 may be formed from any of several comparatively low dielectric constant dielectric materials as are conventional or unconventional in the art of microelectronic fabrication. However, within the present invention it is required that the blanket first dielectric layer 16 be formed of a dielectric material such that upon further treatment in accord with the present invention there is effected within the blanket first dielectric layer 16 a differing surface composition in comparison with an underlying bulk composition. Thus, although any of several comparatively low dielectric constant dielectric materials may be employed for forming the blanket first dielectric layer 16 within the present invention, including but are not limited to spin-on-glass (SOG) dielectric materials, spin-on-polymer (SOP) dielectric materials, nanoporous dielectric materials, amorphous carbon dielectric materials and fluorosilicate glass (FSG) dielectric materials, the comparatively low dielectric constant dielectric material is selected within the context of a particular treatment which provides the foregoing surface and bulk composition differences.

Nonetheless, and in accord with further description and examples below, the present invention provides particular value under circumstances where the blanket first dielectric layer 16 is formed of a silicon and carbon containing (preferably silicon and carbon bonded) low dielectric constant dielectric material, such as but not limited to a cured methylsilsesquioxane (MSQ) dielectric material or more generally a cured organoalkoxysilane dielectric material. Methylsilsesquioxane (MSQ) dielectric materials are available commercially, for example and without limitation, from JSR Co. (Product No. LKD5109), Dow Corning, Inc. (Product No. XLK) and Honeywell, Inc. (Product No. Nanoglass-E). They are also understood chemically as methylalkoxysilanes of general chemical formula $(CH_3)_x$—Si—$(OR)_y$, where $x+y=4$ and each of x and y is at least one. Organoalkoxysilanes are analogous materials where the methyl group(s) is(are) substituted with other carbon bonded groups. Any of the foregoing alkoxysilane materials upon thermal curing condense to form organosiloxane polymeric coating layers.

Typically and preferably, the blanket first dielectric layer 16 is formed to a thickness of from about 4000 to about 6000 angstroms, subsequent to any requisite thermal curing.

Figure 2:
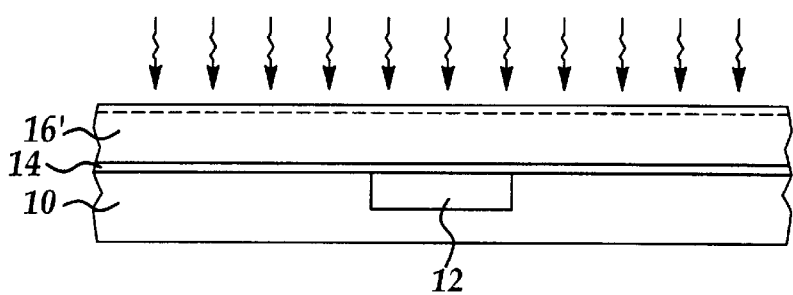

Referring now to FIG. 2, there is shown a schematic cross-sectional diagram illustrating the results of further processing of the microelectronic fabrication whose schematic cross-sectional diagram is illustrated in FIG. 1.

Shown in FIG. 2 is a schematic cross-sectional diagram of a microelectronic fabrication otherwise equivalent to the microelectronic fabrication whose schematic cross-sectional diagram is illustrated in FIG. 1, but wherein the blanket first dielectric layer 16 has been treated with a treatment plasma 18 to form a plasma treated blanket first dielectric layer 16'.

Within the present invention, the treatment plasma 18 employs a treatment gas composition such that there is provided within the plasma treated blanket first dielectric layer 16' a different surface composition of the plasma treated blanket first dielectric layer 16' in comparison with an underlying bulk composition within the plasma treated blanket first dielectric layer 16'.

To effect the foregoing result within the context of a blanket first dielectric layer 16 formed of a cured methylsilsesquioxane (MSQ) dielectric material, the treatment plasma 18 may employ treatment gas compositions including but not limited to oxidizing treatment gas compositions, reducing treatment gas compositions, inert treatment gas compositions and nitriding treatment gas compositions, any of which will provide a reduced carbon concentration within the surface composition of the plasma treated blanket first dielectric layer 16' in comparison with the underlying bulk composition of the plasma treated blanket first dielectric layer 16'. Within the present invention, reducing and inert treatment plasmas are particularly preferred since they provide a reduced carbon content with otherwise minimal impact to blanket first dielectric layer 16 properties upon plasma treatment. Such oxidizing, reducing, inert and/or nitriding treatment gas compositions may include, but are not limited to oxygen, ozone, nitrous oxide, nitric oxide, nitrogen, ammonia, helium and argon treatment gas compositions, with ammonia and helium treatment gas compositions particularly preferred.

Within the preferred embodiment of the present invention, the treatment plasma 18 also employs: (1) a reactor chamber pressure of from about 2 to about 8 torr; (2) a radio frequency power of from about 100 to about 400 watts per square centimeter substrate 10 area; (3) a substrate 10 temperature of from about 300 to about 400 degrees centigrade; and (4) treatment gas composition flow rate of from about 10 to about 50 standard cubic centimeters per minute (sccm). Within the context of the foregoing parameters and limitations, and when treating the blanket first dielectric layer 16 for a time period of from about 0.5 to about 3 minutes, there is formed within the plasma treated blanket first dielectric layer 16' a carbon depleted surface layer of depth from about 1000 to about 2000 angstroms without otherwise appreciably affecting the thickness of the plasma treated blanket first dielectric layer 16'.

Figure 3:
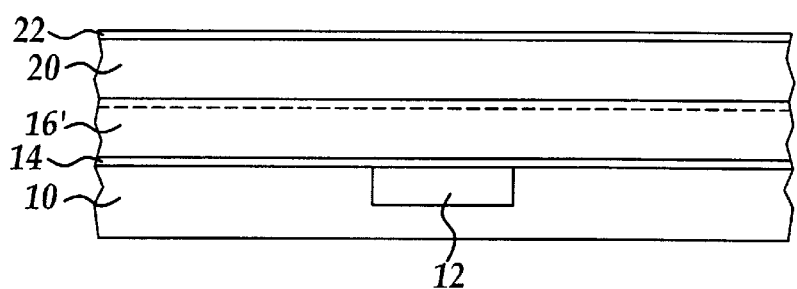

Referring now to FIG. 3, there is shown a schematic cross-sectional diagram illustrating the results of further processing of the microelectronic fabrication whose schematic cross-sectional diagram is illustrated in FIG. 2.

Shown in FIG. 3 is a schematic cross-sectional diagram of microelectronic fabrication otherwise equivalent to the microelectronic fabrication whose schematic cross-sectional diagram is illustrated in FIG. 2, but wherein: (1) there is formed upon the plasma treated blanket first dielectric layer 16' a blanket second dielectric layer 20; and (2) there is formed upon the blanket second dielectric layer 20 an optional blanket planarizing stop layer 22.

Within the preferred embodiment of the present invention, the blanket second dielectric layer 20 is typically and preferably formed employing methods, materials and dimensions analogous, equivalent or identical to the methods, materials and dimensions employed for forming the blanket first dielectric layer 16 as illustrated within the schematic cross-sectional diagram of FIG. 1, although such is not required within the present invention. Similarly, within the preferred embodiment of the present invention, the optional blanket planarizing stop layer 22 is typically and preferably also formed employing methods, materials and dimensions analogous, equivalent or identical to the methods, materials and dimensions employed for forming the optional blanket first etch stop/liner layer 14 as illustrated within the schematic cross-sectional diagram of FIG. 1, although such is also not required within the present invention.

Figure 4:
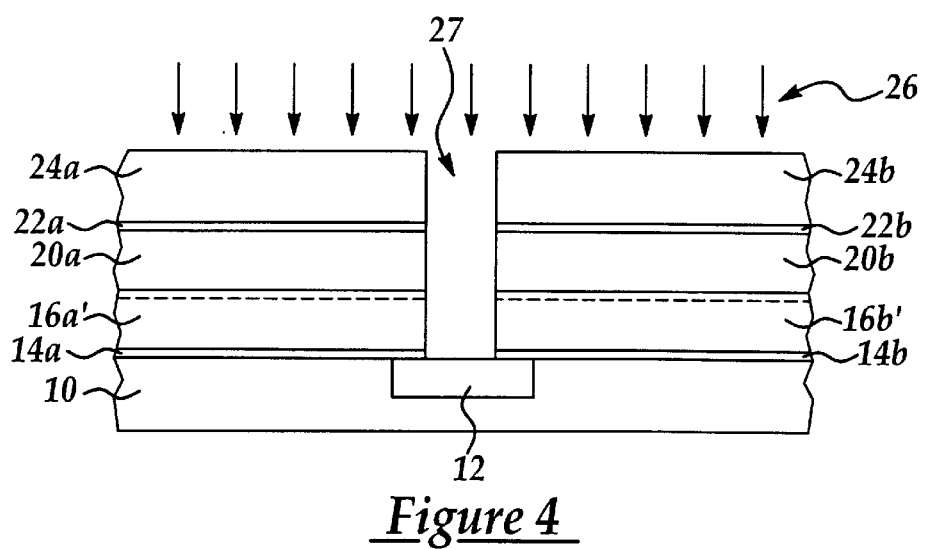

Referring now to FIG. 4, there is shown a schematic cross-sectional diagram illustrating the results of further processing of the microelectronic fabrication whose schematic cross-sectional diagram is illustrated in FIG. 3.

Shown in FIG. 4 is a schematic cross-sectional diagram of a microelectronic fabrication otherwise equivalent to the microelectronic fabrication whose schematic cross-sectional diagram is illustrated in FIG. 3, but wherein, in a first instance, there is formed upon the optional blanket planarizing stop layer 22 a pair of patterned first photoresist layers 24a and 24b. The pair of patterned first photoresist layers 24a and 24b is aligned in general above the contact region 12.

Within the preferred embodiment of the present invention, the pair of patterned first photoresist layers 24a and 24b may be formed of photoresist materials as are conventional in the art of microelectronic fabrication, including but not limited to positive photoresist materials and negative photoresist materials. Typically and preferably, each of the pair of patterned first photoresist layers 24a and 24b is formed to a thickness of from about 4000 to about 6000 angstroms.

Shown also within the schematic cross-sectional diagram of FIG. 4 is the results of sequentially etching: (1) the optional blanket planarizing stop layer 22; (2) the blanket second dielectric layer 20; (3) the plasma treated blanket first dielectric layer 16'; and (4) the optional blanket first etch stop/liner layer 14 to form a corresponding: (1) pair of optional patterned planarizing stop layers 22a and 22b; (2) pair of patterned second dielectric layers 20a and 20b; (3) pair of plasma treated patterned first dielectric layers 16a' and 16b'; and (4) pair of optional patterned first etch stop/liner layers 14a and 14b, while employing the pair of patterned first photoresist layers 24a and 24b as a pair or first etch mask layers, in conjunction with a first etching plasma 26. Within the preferred embodiment of the present invention, the foregoing series of patterned layers defines a first aperture 27 which reaches the contact region 12, although within the present invention there may not necessarily be etched through the optional blanket first etch stop/liner layer 14.

Within the preferred embodiment of the present invention, the first etching plasma 26 typically and preferably employs an etchant gas combination, or series of etchant gas compositions, as is appropriate for the series of materials from which is formed the blanket planarizing stop layer 22, the blanket second dielectric layer 20, the plasma treated blanket first dielectric layer 16' and the optional blanket first etch stop/liner layer 14. Typically and preferably, the first etching plasma 26 will employ at least in part a fluorine containing etchant gas composition.

Figure 5:
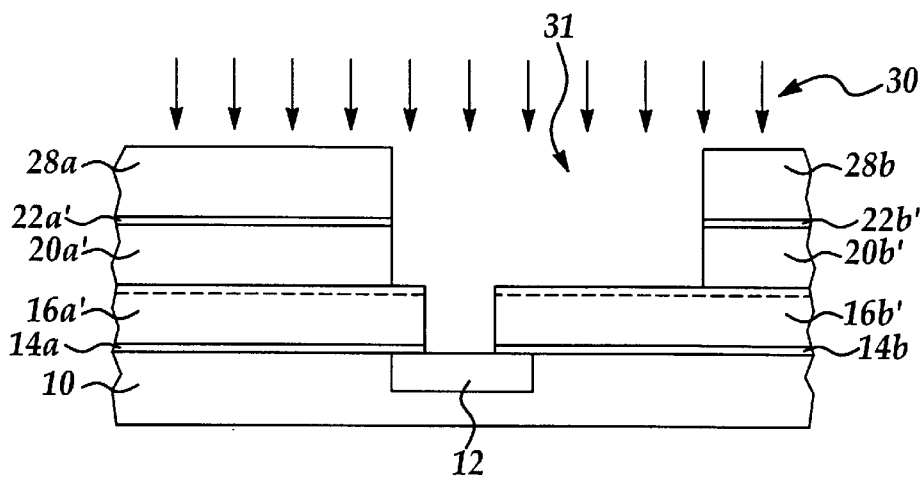

Referring now to FIG. 5, there is shown a schematic cross-sectional diagram illustrating the results of further processing of the microelectronic fabrication whose schematic cross-sectional diagram is illustrated in FIG. 4.

Shown in FIG. 5 is a schematic cross-sectional diagram of a microelectronic fabrication otherwise equivalent to the microelectronic fabrication whose schematic cross-sectional diagram is illustrated in FIG. 4, but wherein, in a first instance, the pair of patterned first photoresist layers 24a and 24b has been stripped from the pair of optional patterned planarizing stop layers 22a and 22b and been replaced with a pair of patterned second photoresist layers 28a and 28b which is separated by a wider aperture.

Within the preferred embodiment of the present invention, the pair of patterned first photoresist layers 28a and 28b may be stripped from the pair of optional patterned planarizing stop layers 22a and 22b while employing methods and materials as are conventional in the art of microelectronic fabrication.

Similarly, the pair of patterned second photoresist layers 28a and 28b may be formed upon the pair of optional patterned planarizing stop layers 22a and 22b while employing methods and materials as are conventional in the art of microelectronic fabrication, and analogous or equivalent to the methods and materials employed for forming the pair of patterned first photoresist layers 24a and 24b.

Finally, there is shown within the schematic cross-sectional diagram of FIG. 5 the results of etching: (1) the pair of optional patterned planarizing stop layers 22a and 22b; and (2) the pair of patterned second dielectric layers 20a and 20b, to form therefrom: (1) a corresponding pair of optional twice patterned planarizing stop layers 22a' and 22b'; and (2) a corresponding pair of twice patterned second dielectric layers 20a' and 20b', while employing the pair of patterned second photoresist layers 28a and 28b as a second etch mask layer, in conjunction with a second etching plasma 30.

As is understood by a person skilled in the art, within the context of the above described etching within the second etching plasma 30, there is formed from the aperture 27 as illustrated within the schematic cross-sectional diagram of FIG. 4 a dual damascene aperture 31 comprising a trench defined by the pair of optional twice patterned planarizing stop layers 22a' and 22b' and the pair of twice patterned second dielectric layers 20a' and 20b', wherein the trench is contiguous with and completely overlaps a via defined by the pair of plasma treated patterned first dielectric layers 16a' and 16b' and the pair of patterned first etch stop/liner layers 14a and 14b.

Within the preferred embodiment of the present invention, the second etching plasma 30 may employ methods, materials and process limitations analogous or equivalent to the methods, materials and process limitation as are employed within the first etching plasma 26. However, an endpoint for the second etching plasma 30 will be determined by a change in etching characteristics of the second etching plasma 30 incident to detection of differences in a second bulk material from which is formed the blanket second dielectric layer 20 in comparison with the first surface material from which is formed the plasma treated surface portion of the plasma treated blanket first dielectric layer 16'.

In accord with the above, and within the preferred embodiment of the present invention when the plasma treated blanket first dielectric layer 16' is formed of a methylsilsesquioxane (MSQ) based dielectric material which has been surface plasma treated to lower within a surface region a carbon concentration, an endpoint is determined when forming the trench within the dual damascene aperture 31 by monitoring a change in carbon content within the second etching plasma 30 or within peripheral exposed portions of the plasma treated patterned first dielectric layers 16a' and 16b'. Such monitoring may be undertaken employing methods as are conventional in the art of microelectronic fabrication, including optical emission spectroscopy methods and in-situ mass spectroscopy methods.

Figure 6:
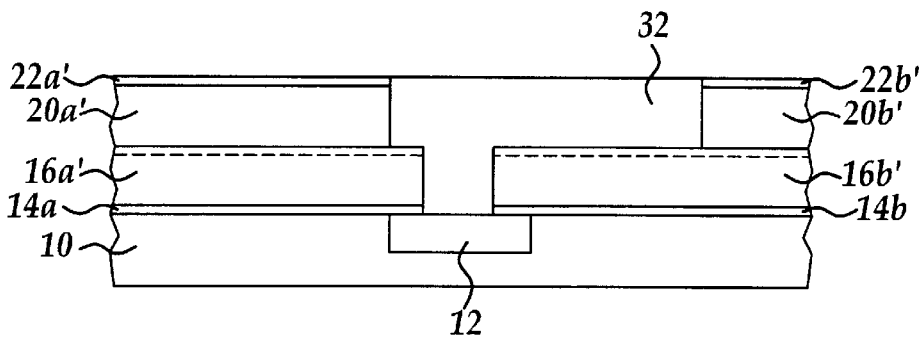

Referring now to FIG. 6, there is shown a schematic cross-sectional diagram illustrating the results of further processing of the microelectronic fabrication whose schematic cross-sectional diagram is illustrated in FIG. 5.

Shown in FIG. 6 is a schematic cross-sectional diagram of a microelectronic fabrication otherwise equivalent to the microelectronic fabrication whose schematic cross-sectional diagram is illustrated in FIG. 5, but wherein, in a first instance, the pair of patterned second photoresist layers 28a and 28b has been stripped from the corresponding pair of optional twice patterned planarizing stop layers 22a' and 22b'.

Within the preferred embodiment of the present invention, the foregoing pair of patterned photoresist layers may also be stripped while employing photoresist stripping methods as are conventional in the art of microelectronic fabrication.

Finally, there is also shown within the schematic cross-sectional diagram of FIG. 6 formed into the dual damascene aperture 31 and contacting the contact region 12 within the substrate 10 a contiguous patterned conductor interconnect and patterned conductor stud layer 32.

Within the present invention, the contiguous patterned conductor interconnect and patterned conductor stud layer 32 may be formed employing methods as are conventional or unconventional in the art of microelectronic fabrication. Typically and preferably, it will be formed employing chemical mechanical polish (CMP) planarizing methods. Similarly, the contiguous patterned conductor interconnect and patterned conductor stud layer 32 may be formed of conductor materials as are conventional in the art of microelectronic fabrication, including but not limited to metal, metal alloy, doped polysilicon and polycide conductor materials, but particularly copper and copper alloy (greater than about 85 weight percent copper) conductor materials. Finally, the contiguous patterned conductor interconnect and patterned conductor stud layer 32 will generally include a conformal barrier layer first formed into the dual damascene aperture 31, such as to attenuate interdiffusion with adjoining layers.

Upon forming the microelectronic fabrication whose schematic cross-sectional diagram is illustrated in FIG. 6, there is formed a microelectronic fabrication in accord with the preferred embodiment of the present invention. The microelectronic fabrication has formed therein a patterned conductor layer having formed interposed between its patterns a dielectric layer formed of a comparatively and optimally low dielectric constant dielectric material layer construction, incident to avoidance use of an intermediate etch stop layer. Such avoidance is realized incident to plasma treatment of a first dielectric layer within a dual damascene structure such as to provide compositional differences which may be detected for etch stop purposes. While the preferred embodiment of the present invention employs a plasma treatment to provide the compositional differences, under appropriate circumstances a wet chemical treatment may also prove efficacious.

EXAMPLES

In order to illustrate the value of the present invention, there was obtained two semiconductor substrates and formed upon each semiconductor substrate a layer of a methylsilsesquioxane (MSQ) based dielectric material through coating of product number LKD5109 methylsilsesquioxane (MSQ) dielectric material solution available from JSR Co. and curing at a temperature of about 400 degrees centigrade for a time period of about 30 minutes. Nominal thickness of the pair of cured dielectric layers was about 10000 angstroms each.

One of the pair of dielectric layers was treated in an ammonia plasma at a reactor chamber pressure of about 5 torr, a radio frequency power of about 250 watts, a semiconductor substrate temperature of about 400 degrees centigrade and an ammonia flow rate of about 30 standard cubic centimeters per minute (sccm), for a time period of about 1 minute.

The other of the pair of dielectric layers was treated otherwise equivalently, but with a helium plasma (employing same parameters and limitations) rather than an ammonia plasma.

Thicknesses, dielectric constants and indicies of refraction were measured for the two dielectric layers before and after plasma treatment. The results are reported within Table I.

TABLE I

|  | NH3 Plasma | He Plasma |
| --- | --- | --- |
| Thickness Before | 4978 | 4986 |
| Thickness After | 4981 | 4967 |
| Refr. Index Before | 1.24 | 1.24 |
| Refr. Index After | 1.24 | 1.24 |
| Dielec. Const. Before | 2.21 | 2.20 |
| Dielec. Const. After | 2.28 | 2.32 |

As is seen from review of the data within Table I, there is generally an inappreciable change in thickness, no discernable change in refractive index and a generally small increase in dielectric constant, incident to treating the pair of dielectric layers within either the comparatively mild ammonia plasma or the comparatively mild helium plasma.

There was also determined for the pair of plasma treated dielectric layers a carbon content profile while employing a secondary ion mass spectroscopy (SIMS) method as is conventional in the art of microelectronic fabrication.

Figure 7:
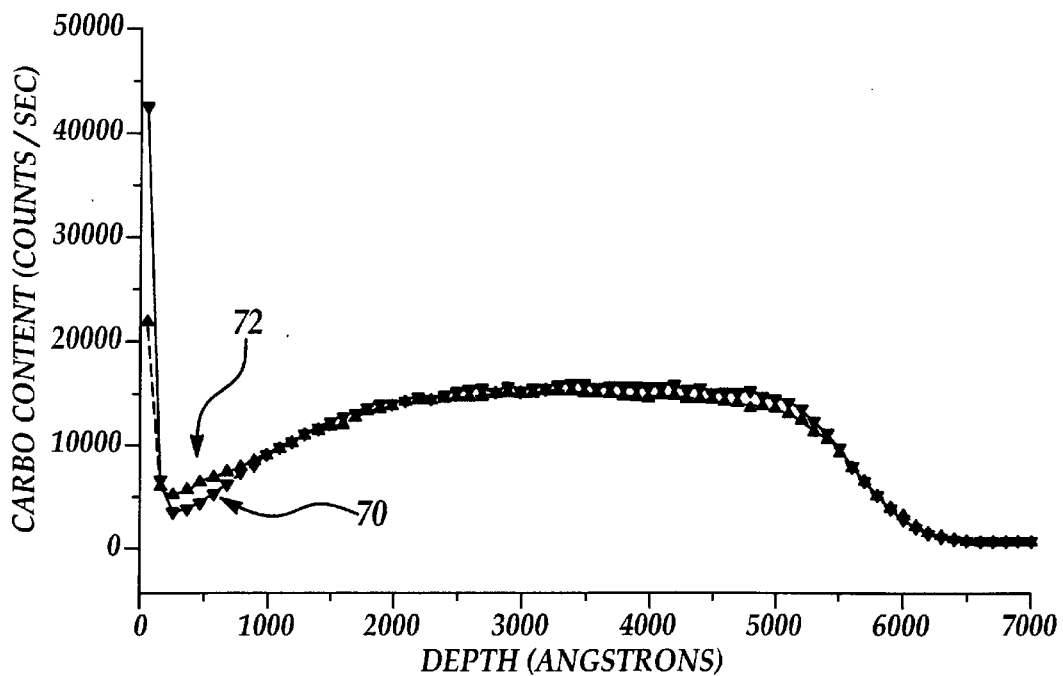
FIG. 7 shows a graph of Carbon Content versus Depth for a pair of plasma surface treated cured methylsesquioxane (MSQ) dielectric layers formed in accord with the examples of the present invention.

The results of the secondary ion mass spectroscopy (SIMS) analysis is illustrated within the graph of FIG. 7, wherein the curve which corresponds with reference numeral 70 corresponds with the ammonia plasma treated dielectric layer and the generally coincident curve which corresponds with reference numeral 72 corresponds with the helium plasma treated dielectric layer. As is illustrated within the graph of FIG. 7, and in accord with the present invention, there is a considerably decreased carbon content within about a 1000 to about 2000 angstroms surface layer of the plasma treated dielectric layers in comparison with underlying bulk layers of the plasma treated dielectric layers. Such a decreased carbon content provides basis for a measurable endpoint in accord with the present invention.

As is understood by a person skilled in the art, the preferred embodiment and example of the present invention are illustrative of the present invention rather than limiting of the present invention. Revisions and modifications may be made to methods, materials, structures and dimensions through which is provided a method for forming patterned conductor layer in accord with the preferred embodiment of the present invention, while still providing a method for forming a dual damascene aperture in accord with the present invention, further in accord with the accompanying claims.

What is claimed is:

1. A method for forming a dual damascene aperture comprising:

providing a substrate;

forming over the substrate a first dielectric layer;

surface treating the first dielectric layer to form a surface treated first dielectric layer having a first surface composition different than a first bulk composition;

forming upon the surface treated first dielectric layer a second dielectric layer having a second bulk composition; and forming through the second dielectric layer a trench contiguous with and overlapping a via formed through the surface treated first dielectric layer, wherein when forming the trench through the second dielectric layer an endpoint is determined by detecting a difference between the second bulk composition and the first surface composition.

2. The method of claim 1 further comprising forming into the trench contiguous with the via a contiguous patterned conductor interconnect and patterned conductor stud layer.

3. The method of claim 1 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

4. The method of claim 1 wherein each of the first dielectric layer and the second dielectric layer is formed of a comparatively low dielectric constant dielectric material selected from the group consisting of spin-on-glass dielectric materials, spin-on-polymer dielectric materials, nanoporous dielectric materials, amorphous carbon dielectric materials and fluorosilicate glass dielectric materials.

5. The method of claim 1 wherein each of the first dielectric layer and the second dielectric layer is formed to a thickness of from about 4000 to about 6000 angstroms.

6. The method of claim 1 wherein the surface treatment is selected from the group consisting of wet chemical surface treatments and dry plasma surface treatments.

7. The method of claim 2 wherein the contiguous patterned conductor interconnect and patterned conductor stud layer is formed of a conductor material selected from the group consisting of copper and copper alloy conductor materials.

8. The method of claim 1 wherein an etch stop layer is not formed interposed between the surface treated first dielectric layer and the second dielectric layer.

9. A method for forming a dual damascene aperture comprising:

providing a substrate;

forming over the substrate a first dielectric layer formed of an organosiloxane dielectric material;

surface treating the first dielectric layer to form a surface treated first dielectric layer having a first surface carbon composition less than a first bulk carbon composition;

forming upon the surface treated first dielectric layer a second dielectric layer having a second bulk composition; and forming through the second dielectric layer a trench contiguous with and overlapping a via formed through the surface treated first dielectric layer, wherein when forming the trench through the second dielectric layer an endpoint is determined by detecting a difference between the second bulk composition and the first surface carbon composition.

10. The method of claim 9 further comprising forming into the trench contiguous with the via a contiguous patterned conductor interconnect and patterned conductor stud layer.

11. The method of claim 9 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

12. The method of claim 9 wherein each of the first dielectric layer and the second dielectric layer is formed to a thickness of from about 4000 to about 6000 angstroms.

13. The method of claim 9 wherein the surface treatment is selected from the group consisting of wet chemical surface treatments and dry plasma surface treatments.

14. The method of claim 9 wherein the surface treatment is a plasma treatment employing a plasma selected from the group consisting of oxidizing plasmas, reducing plasmas, nitriding plasmas and inert plasmas.

15. The method of claim 10 wherein the contiguous patterned conductor interconnect and patterned conductor stud layer is formed of a conductor material selected from the group consisting of copper and copper alloy conductor materials.

16. The method of claim 9 wherein an etch stop layer is not formed interposed between the surface treated first dielectric layer and the second dielectric layer.

* * * * *